(12) United States Patent
Gundlach et al.

(10) Patent No.: US 7,724,002 B2
(45) Date of Patent: May 25, 2010

(54) CAPACITIVE SENSOR

(75) Inventors: Jochen Gundlach, Wasserburg (DE); Jaromir Palata, Friedrichshafen (DE)

(73) Assignee: i f m electronic GmbH, Essen (DE)

( * ) Notice: Subject to any disclaimer, the term of this patent is extended or adjusted under 35 U.S.C. 154(b) by 149 days.

(21) Appl. No.: 11/953,517

(22) Filed: Dec. 10, 2007

(65) Prior Publication Data

US 2008/0204051 A1    Aug. 28, 2008

(30) Foreign Application Priority Data

Dec. 10, 2006  (DE) ....................... 10 2006 058 442

(51) Int. Cl.
  *G01R 27/26*  (2006.01)
(52) U.S. Cl. .................... 324/686; 324/658; 324/682
(58) Field of Classification Search ............. 324/658, 324/682, 686
  See application file for complete search history.

(56) References Cited

U.S. PATENT DOCUMENTS 3,816,811 A * 6/1974 Cmelik K. ................. 324/667
3,986,109 A * 10/1976 Poduje ...................... 324/662
4,287,471 A * 9/1981 Ko et al. .................... 324/725
5,650,730 A   7/1997 Herbst, Jr.
5,793,217 A * 8/1998 Herbst, Jr. .................. 324/690

* cited by examiner

*Primary Examiner*—Timothy J Dole
*Assistant Examiner*—Farhana Hoque
(74) *Attorney, Agent, or Firm*—David S. Safran; Roberts Mlotkowski Safran & Cole, P.C.

(57) ABSTRACT

A capacitive sensor with at least one reference impedance and at least one measuring condenser (5), with at least one electrical alternating signal source (6), with a current supply network as well as with an analysis unit (7) in which the reference impedance and the measuring condenser (5) are connected via the current supply network to the alternating signal source (6) and the analysis unit (7) in such a way that the charge and discharge currents of the reference impedance and the measuring condenser (5) can be analyzed—at least partially—by the analysis unit (7). The capacitive sensor avoids—at least partially—drawbacks in the known capacitive sensors in that the reference impedance can be tuned.

17 Claims, 10 Drawing Sheets

CAPACITIVE SENSOR

BACKGROUND OF THE INVENTION

1. Field of Invention

The invention relates to a capacitive sensor with at least one reference impedance and at least one measuring condenser, with at least one electrical alternating signal source, with a current supply network as well as with an analysis unit, whereby the reference impedance and the measuring condenser are connected via the current supply network to the alternating signal source and the analysis unit in such a way that the charge and discharge currents of the reference impedance and the measuring condenser can be analyzed—at least partially—by the analysis unit. In particular, in this case, this can be a capacitive sensor with at least a first connection and a second connection, with at least one reference impedance and a measuring condenser, with at least one electrical alternating signal source, with an analysis unit as well as with a diode ring that consists of at least four diodes that are connected one behind the other in series and in the same direction, whereby the diode ring has a first connection between the first diode and the second diode, a second connection between the second diode and the third diode, a third connection between the third diode and the fourth diode, and a fourth connection between the fourth diode and the first diode, whereby the first electrode of the reference impedance is connected to the fourth connection of the diode ring, the second electrode of the reference impedance is connected to a reference potential, and the first electrode of the measuring condenser is connected to the second connection of the diode ring, whereby the first connection of the sensor is connected to the first connection of the diode ring, and the second connection of the sensor is connected to the third connection of the diode ring, whereby the first connection of the sensor and the second connection of the sensor are connected or can be connected to the analysis unit and whereby the electrical alternating signal from the electrical alternating signal source strikes the first connection of the diode ring and the third connection of the diode ring.

2. Description of Related Art

Capacitive sensors of the previously described type are known from the U.S. Pat. Nos. 5,650,730 and 5,793,217 and are used to determine the capacitance of the measuring condenser or the change in capacitance of the measuring condenser. In this case, in the capacitive sensor itself, often, only one electrode of the measuring condenser is designed, and the other electrode of the measuring condenser is formed by the surrounding area of the capacitive sensor. Thus, the measuring condenser is normally not a condenser in terms of a complete electrotechnical component, but rather an arrangement that is equipped with a capacitance whose active electrode is assigned to the capacitive sensor, whereby an electrical stray field extends from the active electrode into the surrounding area.

In the prior art, in most cases, a reference condenser is used as a reference impedance. Where there is concrete mention below of a reference capacitance, the embodiments still generally apply to a reference impedance; the capacitance of the reference condenser then corresponds to the value of the reference impedance, independently thereof, as the reference impedance is implemented as a component. The charge and discharge currents of a reference condenser then correspond to the charge and discharge currents of a reference impedance, whereby the reference impedance can convert the energy supplied to it in some other way than only in the electric field of a condenser.

The capacitance of the above-described sensor can be changed, on the one hand, if the geometry of the arrangement, and thus, the stray field of the active electrodes is changed; on the other hand, the capacitance of the sensor—without a change in the extension of the stray field—can also change in an alteration of the dielectric properties of the space, in which the electric field extends. Because of these general properties, capacitive sensors are frequently used as proximity switches and as fill-level detectors.

In capacitive sensors of the initially described type, the alternating signal source is usually designed as an oscillator, such as, for example, as a harmonic oscillator in the form of an LRC network, which is switched in such a way that it executes a continuous oscillation. As the signal level within the positive semioscillation of the alternating signal increases, the measuring condenser is charged via a current that flows over the first connection of the sensor, the first connection of the diode ring, and the second diode of the diode ring, and the reference impedance—frequently designed as a reference condenser—is charged during the latter with a current that flows via the second connection of the sensor, the third connection of the diode ring and the fourth diode of the diode ring. As the signal level of the positive semioscillation of the alternating signal decreases, the second diode and the fourth diode of the diode ring are blocked, via which the measuring condenser and the reference condenser had been pre-charged, while the previously locking first diode and third diode of the diode ring are now conductive. The charge stored during the charging process in the measuring condenser now flows over the third diode of the diode ring, the third connection of the diode ring, and the second connection of the sensor. During the negative semioscillation of the alternating signal, this process is repeated in a corresponding way.

The mode of operation of the above-described capacitive sensor is consequently based on the fact that the charge current of the reference impedance, which can be configured in particular as a reference condenser, or the charge current of the measuring condenser, in each case flows over a connection of the sensor that is different from the discharge current of the reference condenser or the measuring condenser. If the capacitances of the reference condenser and the measuring condenser are equally large, the current that flows into the first connection of the diode ring on average is equal to the current that flows out from the first connection of the diode ring, and the same applies for the third connection of the diode ring. If the capacitances of the reference condenser and the measuring condenser, however, vary in size, a resulting current that flows into the first connection of the diode ring and correspondingly flows out of the third connection of the diode ring is produced in the average time—for the case that the capacitance of the measuring condenser is larger than the capacitance of the reference condenser—and a current that flows out, in the average time, from the first connection of the diode ring and in a corresponding manner a current that flows, in the average time, into the third connection of the diode ring are produced—for the case that the capacitance of the measuring condenser is smaller than the capacitance of the reference condenser. By analyzing the differential currents with the analysis unit that is connected to the first connection and the second connection of the capacitive sensor, it is evident what the ratio is between the capacitance of the measuring condenser and the capacitance of the reference condenser.

In the generic capacitive sensors known from the U.S. Pat. Nos. 5,650,730 and 5,793,217, the currents that flow via the reference condenser and the measuring condenser into the analysis unit are fed via two current-voltage transformers to a summator, which processes the voltages with different signs so that a differential signal results. This differential signal is ultimately—after possible additional intermediate steps pertaining to circuit engineering—compared to a reference or threshold signal, whereby the reference signal defines a threshold, which, when reached, indicates a specific event, such as, e.g., a sufficient proximity of an object to the capacitive sensor or the presence/absence of a specific fill level.

The disadvantage to the above-described capacitive sensor is that the analysis of the current signals in the analysis unit is comparatively expensive. In particular, the specification of a reference value, to which the difference of the current voltage-converted currents is compared, is labor-intensive and costly in terms of circuit engineering, and in addition, is prone to frequency and amplitude fluctuations of the alternating signal. Also, it has been found that the known sensors, in the working frequency of 2 MHz indicated in the prior art, are not suitable to be used as fill-level sensors, since they then are not able to distinguish whether a medium fills a larger area of volume around the sensor or whether only a small adhesion of this medium to the sensor has been left after the medium has left the area of the capacitive sensor that is to be monitored; the fill level thus drops below the position of the capacitive sensor.

SUMMARY OF THE INVENTION

The object of this invention is to avoid—at least partially—the indicated drawbacks in the known capacitive sensors of the type in question here.

The capacitive sensor according to the invention, in which the previously deduced and indicated object is achieved, is characterized first and essentially in that the reference impedance can be tuned. By this simple measure, the value of the reference impedance—and thus, also the capacitance of a reference impedance that is configured as a reference condenser—can be adjusted, in any desired state of influence of the capacitive sensor, to the impedance or capacitance of the measuring condenser that is tied to the state of influence. Because of the ability to make adjustments within the range of the actual capacitive sensor, no ability to make adjustments or to set a zero point within the analysis unit is needed, so that the analysis unit can be produced significantly more simply and economically in terms of circuit engineering.

As stated initially, the starting point of the invention may be a capacitive sensor with at least a first connection and a second connection, with at least one reference impedance and a measuring condenser, with at least one electrical alternating signal source, with an analysis unit as well as with a diode ring that consists of at least four diodes that are connected one behind the other in series and in the same direction, whereby the diode ring has a first connection between the first diode and the second diode, a second connection between the second diode and the third diode, a third connection between the third diode and the fourth diode, and a fourth connection between the fourth diode and the first diode, whereby the first electrode of the reference impedance is connected to the fourth connection of the diode ring, the second electrode of the reference impedance is connected to a reference potential, and the first electrode of the measuring condenser is connected to the second connection of the diode ring, whereby the first connection of the sensor is connected to the first connection of the diode ring, and the second connection of the sensor is connected to the third connection of the diode ring, whereby the first connection of the sensor and the second connection of the sensor are connected or can be connected to the analysis unit and whereby the electrical alternating signal from the electrical alternating signal source strikes the first connection of the diode ring and the third connection of the diode ring. Such a starting point is not necessary. Hereinafter, however, it is always assumed that the capacitive sensor according to the invention is embodied in this way in particular.

The configuration of the capacitive sensor according to the invention is also very advantageous for the following reason. It is immediately evident that the level of the currents flowing into or from the first connection of the diode ring and into or from the third connection of the diode ring is not only dependent upon the size of the reference impedance or the capacitance of the reference condenser and the measuring condenser, but rather the level of the currents is also a direct function of the frequency and the amplitude of the alternating signal that arrives at the capacitive sensor. This is substantiated in the frequency dependency of the reactance and the amplitude dependency of the current by a reactance of the voltage that is right next to the reactance.

If the alternating signal that is produced by the alternating signal source is subject to a change in frequency or a change in amplitude, this has an effect on the level of the currents, which are exchanged with the analysis unit via the first connection and the second connection of the capacitive sensor. Consequently, the differential signal, which is formed in the prior art in the analysis unit from two currents, is also dependent on a change in the alternating signal in the frequency and/or in the amplitude. Since the comparison or threshold voltage within the analysis unit absolutely must not change in a corresponding way, however—this actually is even completely unlikely since there is no linkage with the alternating signal source—the reliability of the result, which yields the capacitive sensor known from the prior art, is dependent on a consistent alternating signal, whereby "consistent" refers to the constancy of the alternating signal in its frequency and amplitude.

In the capacitive sensor according to the invention, such a dependency of the measuring result on the alternating signal produced by the alternating signal source is no longer present. Since the adjustment of the threshold value takes place directly in the measuring condenser and an alternating signal that is variable in the frequency and in the amplitude has an effect both on the reference impedance or the reference condenser and on the measuring condenser, a state of influence defined by the tuning of the reference impedance or the reference condenser is still recognized, essentially independently of the frequency and amplitude resistance of the alternating signal.

According to a first advantageous embodiment of the invention, the reference impedance can be switched via a switch, such that only defined parts of the currents flowing over the relevant diodes of the diode ring for the charging or discharging of the switched reference impedance are available. This measure makes it possible to control the value of the switched reference impedance or the capacitance of the switched reference condenser all the way from zero—switch is continuously open—to the nominal value of the reference impedance or the nominal capacitance of the reference condenser—switch is continuously closed. The reference impedance or the reference condenser can be switched in particular in that the connection of the second electrode of the reference impedance or the reference condenser is switched with the reference potential or the connection of the first electrode of the reference impedance or the reference condenser is switched with the first connection of the diode ring.

The adjustment of the impedance or capacitance intermediate values is achieved more precisely in another preferred embodiment in that the switch can be actuated and is actuated via a pulse-width-modulated signal. It is especially advantageous when the pulse-width-modulated signal for switching the switch has a frequency above the frequency of the alternating signal from the alternating signal source, since corresponding currents from each range of the oscillation then contribute to the charge of the switched reference condenser or the switched portion of the reference condenser. In the case of high or very high measuring frequencies—for example, with alternating signal frequencies in the range of 150 MHz—it is more advantageous, however, when the pulse-width-modulated signal for switching the switch has a frequency below the frequency of the alternating signal from the alternating signal source, since this imposes less stringent requirements on the scanning and on average is equally effective in any range of the oscillation.

As an alternative to the conversion of the tunable reference condenser by means of a switch, a capacitance diode is used as a reference condenser in another preferred embodiment of the capacitive sensor, and said capacitance diodes are also referred to as varicaps or varactors, which, however, generally require a high control voltage, for example control voltages of a few tens of volts, which are not available in common digital switches and therefore must be produced first. In contrast, the previously presented solution of the tunable reference condenser with a switch that is actuated by a pulse-width-modulated signal is therefore also advantageous, since to produce the pulse-width-modulated signal to actuate the switch directly, the starting signal of a microcontroller port can be used without the signal requiring amplification.

According to a second, independent teaching of the invention, with which the previously indicated object is achieved, the alternating signal source is connected via a first coupling condenser to the first connection of the diode ring and via a second coupling condenser to the third connection of the diode ring.

Within the scope of the invention, it has been found that, with use of the capacitive sensor according to the invention, a differentiation between an only slight adhesion of a medium to the sensor and the surrounding area of the sensor with a large volume of the medium—application fill-level measurement—is all the more possible the higher the frequency of the electrical alternating field that is emitted by the measuring condenser. This may have to do with the frequency dependency of the dielectric polarization and with the reduction of the contribution of the orientation polarization to the dielectricity of a medium at very high frequencies. To this end, however, frequencies of the alternating signal are necessary that lie far above the working frequency of 2 MHz of the electrical alternating signal source, which are common in the known sensors on which the invention is based.

The requirement of very high frequencies of the alternating signal from the alternating signal source contradicts, however, the usual type of signal coupling of the alternating signal source in the first connection or the third connection of the diode ring, namely the inductive signal coupling by coils. In this case, the primary coil is usually comprised by the alternating signal source that is designed as an LRC oscillator and in each case a secondary coil that is coupled to the primary coil is introduced into the connection of the first connection of the diode ring with the first connection of the sensor and into the connection of the third connection of the diode ring with the second connection of the sensor. Such a coupling of the alternating signal from the alternating signal source via inductive transmitters is problematic also and in particular for high frequencies far beyond the known working frequency of 2 MHz, i.a., therefore, since the inductivity of such transmitters is dependent on frequency, for example, because of the frequency dependency of the permeability number of various materials. The capacitive coupling of the alternating signal according to the invention in the diode ring has turned out to be very unproblematic in contrast to this.

According to another advantageous configuration of the second teaching of the invention, the first connection of the diode ring is connected via a first coil to the first connection of the capacitive sensor, and the third connection of the diode ring is connected via a second coil to the second connection of the capacitive sensor. The first coil and the second coil, however, are not used for coupling the alternating signal in the diode ring, but rather they have a favorable effect on the signal quality in a known way.

According to another advantageous configuration of the second teaching of the invention, the frequency of the alternating signal source and thus the frequency of the alternating signals produced from the alternating signal source—in a desired range—can be preset. Therefore, this is advantageous, since the capacitive sensor, by the selection and the presetting of a suitable frequency of the alternating signal, can be optimally matched to the physical properties of the medium to be detected—in particular, at fill-level measurements. This property can be converted especially advantageously when the alternating signal source is embodied as a controlled oscillator, such as, e.g., as a voltage, current or resistance-controlled oscillator or else as a digital oscillator.

In another preferred configuration of the second teaching of the invention, the alternating signal source produces alternating signals at a frequency of more than 10 MHz, whereby, in particular, frequencies of more than 100 MHz are used. Frequencies within ISM bands, which are released for industrial, scientific and medical applications, can be used especially advantageously. In this connection, in particular, the frequency range of 433.05 MHz to 434.79 MHz is suitable, since here these are frequencies that are still easily assimilated and frequencies of this order of magnitude are especially suitable, since at these frequencies of the alternating signal and the emitted electrical alternating field, the above-described problem is not associated with the adhesion of the medium to the capacitive sensor.

In an especially preferred configuration of the capacitive sensor—both according to the first and the second teaching of the invention—as already indicated several times, the reference impedance is designed as a reference condenser, whereby the reference condenser comprises, in particular, a first, non-tunable reference condenser and a second, tunable reference condenser, whereby it is especially advantageous to switch in parallel the first, non-tunable reference condenser and the second, tunable reference condenser. In this arrangement, the capacitance of the entire reference condenser can be triggered by a minimum capacitance, which corresponds to the nominal capacitance of the non-tunable reference condenser—switch is continuously open—up to a maximum capacitance, which is produced from the sum of the nominal capacitance of the first, non-tunable reference condenser and the nominal capacitance of the second, tunable reference condenser. By appropriately switching the second, tunable reference condenser in and out, each capacitance value between these two values can be set.

In another advantageous configuration of the teaching of the invention, it is provided that the reference impedance is produced by at least one semiconductor component, whereby the semiconductor component is actuated in particular by a pulse-width-modulated signal that is produced by a control device, whereby the pulse-width-modulated signal is filtered in particular through a low pass. If the issue is that the reference impedance is produced by at least one semiconductor component, then this obviously also comprises a switch that comprises a semiconductor component, whereby the semiconductor component then contributes decisively to the production of the active impedance; this is especially the case if the corresponding charge and discharge currents from the current supply network flow via the semiconductor component.

A special advantage when using a semiconductor component is the—basically achievable in any case—high-frequency capacity and the associated precise, high-frequency ability to trigger a reference impedance. Digital potentiometers that are known in the art usually have only one bandwidth of a few 100 kHz at a resistance in a range of several 10 kΩ up to several 100 kΩ. Thus, the known digital potentiometers for the application that is advantageous here are not suitable, since the reference impedance should be in particular less than 100Ω in many switch variants according to the invention.

It has also proven advantageous when a transistor, in particular, a bipolar transistor in an emitter follower circuit or a junction field effect transistor (JFET), is used as a semiconductor component. Also advantageous is the use of a photoconductive cell or an optical coupler. Preferably, a control electrode of the semiconductor component is triggered via the—in particular low-pass-filtered—pulse-width-modulated signal.

If "a control electrode" of the semiconductor component is the item in question, then the base electrode of the transistor is meant in the case of the bipolar transistor in the emitter follower circuit, and the gateway electrode is meant in the case of a JFET. In the case of the photoconductive cell, the control electrode is not an electrode in the objective, circuit-related sense of the term, but rather the area of the photoconductive cell that can be influenced by means of suitable electromagnetic radiation, and in the case of the optical coupler, the control electrode consists of the connections of the phototransmitter.

In an especially preferred configuration of the invention, the control device detects the current that flows through the semiconductor component, determines the impedance of the semiconductor component from the detected current, and adjusts the value of the reference impedance—i.e., the semiconductor component—by suitable triggering of the semiconductor component to a specified impedance value. This measure makes it possible to create a loop overall.

In another preferred configuration of the invention, a control device tunes the reference impedance, such that the value of the reference impedance essentially follows the value of the impedance of the measuring condenser, in particular by the charge and discharge currents of the reference impedance and the measuring condenser being compensated for. This has the result that the current supply network on average is always in equilibrium even when the alternating signal source is actuated with variable frequency ("wobble generator").

In another advantageous configuration of the capacitive sensor according to the invention, the measuring condenser is connected via an electrical line to the current supply network, such that the electrical line and the measuring condenser form a resonator, whereby the electrical line is in particular a coaxial line and/or whereby the resonator in particular is a λ/4 resonator. By this measure, in particular by the use of a coaxial line, resonance frequencies up to the megahertz and gigahertz range can be achieved in a simple way, whereby in this frequency range, the differentiation between an only slight adhesion of a medium to the sensor and the surrounding area of the sensor with a large volume of the medium—as described above—is especially very possible.

The resonance frequency of the arrangement that is comprised of an electrical line—coaxial line—and measuring condenser depends on, i.a., the length of the electrical line, whereby the resonance frequency is all the higher the shorter the electrical line. To influence the resonance frequency of the resonator, a coil is provided in the electrical line in another configuration of the invention, whereby the resonance frequency of the resonator is reduced in particular by the inductivity of the coil; the inductivity of the coil "extends" the electrical line by electrical means, as it were. As a result, the resonance frequency of the resonator can be adjusted in particular also to frequencies in the range of 150 MHz, so that medium adhesions of larger medium volumes can be distinguished.

In another advantageous configuration of the teaching of the invention, the analysis unit and/or the control device is/are equipped so that the impedance of the measuring condenser can be analyzed by measuring the resonance frequency of the resonator and the current that flows in the case of resonance. This specifically refers here to impedance, since a real measuring condenser has not only capacitive properties, but as a whole manifests itself as impedance. By measuring the resonance frequency of the resonator and the current that flows in the case of resonance, not only the impedance of the measuring condenser but also the impedance of the resonator can be analyzed when the measuring condenser and a suitably designed electrical line as a whole form a resonator.

In another configuration, the analysis unit and/or the control device is/are configured in such a way that the impedance of the measuring condenser is determined by the resonator being actuated at any frequency but essentially at a fixed selected frequency, and the current that is detected in the influenced state of the measuring condenser is compared to the current that is detected in the uninfluenced state of the measuring condenser. In another configuration of the invention, the level of the detected current and/or the level of the calculated current difference is used as a switch criterion, e.g., in a capacitive sensor that is configured as a proximity switch.

An advantageous configuration of the capacitive sensor according to the invention is distinguished in that the alternating signal source and/or the analysis unit and/or the control device is/are configured such that the resonance frequency of the resonator can be determined, and the measured resonance frequency of the resonator is compared to the specified or determined resonance frequency of the resonator in the uninfluenced state of the capacitive sensor, whereby in particular the difference of the resonance frequencies of the resonator can be analyzed. In this embodiment, due consideration is paid to the fact that the resonance frequency of the resonator changes with changing external influence of the resonator or the measuring condenser. If, for example, a specific difference of the resonance frequency is achieved, a switching process can be triggered in a capacitive sensor that is designed as a proximity switch.

In particular, there are now various possibilities to configure and to further develop the capacitive sensors according to the invention. To this end, reference is mad to the description of the preferred embodiments in connection with the accompanying drawings.

DETAILED DESCRIPTION OF THE INVENTION

Figure 1:
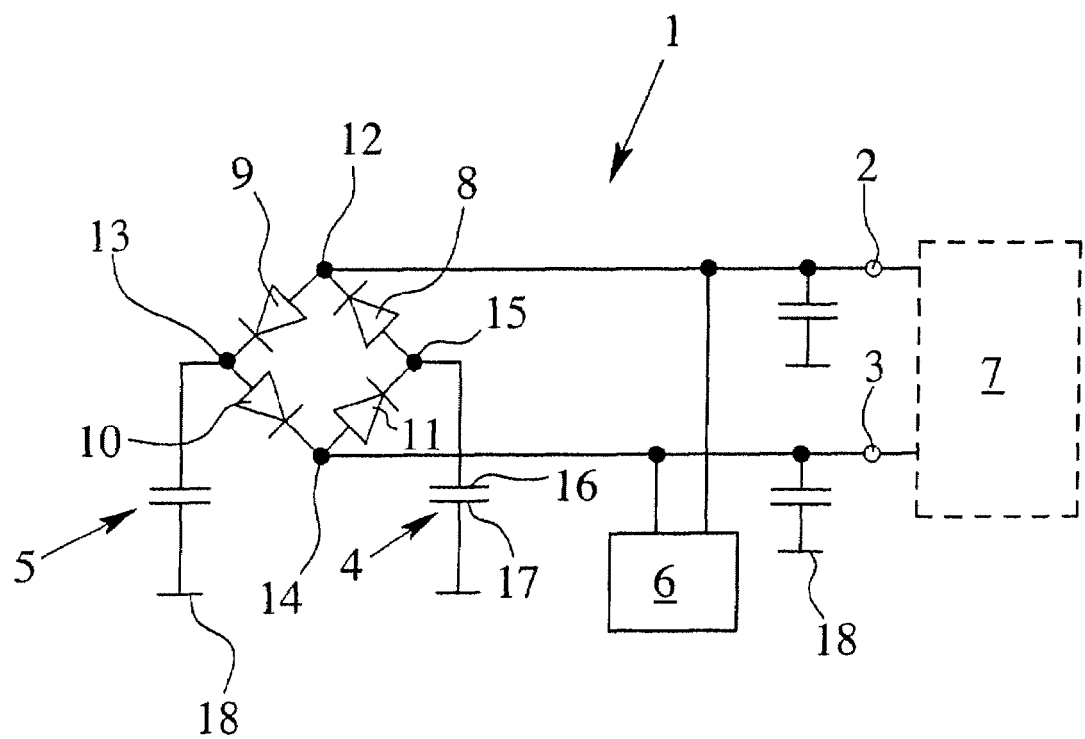
FIG. 1 shows a capacitive sensor that is known from the prior art.

FIG. 1 shows a capacitive sensor 1, as it is known from the prior art. On a first connection 2 and a second connection 3, the capacitive sensor 1 has a reference impedance that is configured as a—non-tunable—reference condenser 4 and a measuring condenser 5, an electrical alternating signal source 6, an analysis unit 7, as well as a diode ring that consists of four diodes 8, 9, 10, 11 that are connected one behind the other in series and in the same direction. In the embodiments according to FIGS. 1 to 6, the reference impedance is always embodied as a reference condenser 4.

The diode ring has a first connection 12 between the first diode 8 and the second diode 9, a second connection 13 between the second diode 9 and the third diode 10, a third connection 14 between the third diode 10 and the fourth diode 11, and finally a fourth connection 15 between the fourth diode 11 and the first diode 8. The first electrode 16 of the reference condenser 4 is connected to the fourth connection 15 of the diode ring, and the second electrode 17 of the reference condenser 4 is connected to a reference potential 18, which corresponds to the ground potential of the switch in the embodiment shown. The first electrode of the measuring condenser 5 is connected to the second connection 13 of the diode ring.

In FIGS. 1, 2 and 5 to 7, the measuring condenser 5 is always shown with the graphic symbol that is common for a condenser—in terms of an electrical component. Actually, in the case of the applications that are common for a capacitive sensor, the second electrode of the measuring condenser 5 is formed by the surrounding area of the capacitive sensor, and the capacitance is formed between the first electrode of the measuring condenser 5 and the surrounding area of this active electrode of the measuring condenser 5.

In the known capacitive sensor according to FIG. 1, the first connection 2 of the sensor is further connected to the first connection 12 of the diode ring, and the second connection 3 of the sensor is connected to the third connection 14 of the diode ring, whereby the first connection 2 of the sensor and the second connection 3 of the sensor are connected to the analysis unit 7. Moreover, the electrical alternating signal from the electrical alternating signal source 6 strikes the first connection 12 of the diode ring and the third connection 14 of the diode ring.

In FIG. 1, it is shown that the alternating signal source 6 is connected in an electrically conductive manner to the first connection 12 and the third connection 14 of the diode ring. This is not necessary, however; rather, it is also known from the prior art that the signal that is produced by the alternating signal source 6 is coupled inductively to the first connection 12 and the third connection 14 of the diode ring. Also, it is known to provide an alternating signal source in each case in the feeds between the first connection 2 of the sensor 1 and the first connection 12 of the diode ring as well as the second connection 3 of the sensor 1 and the third connection 14 of the diode ring, provided that two alternating signal sources work synchronously. The alternating signal source 6 is an LRC oscillator in the depicted embodiment according to FIG. 1.

Based on the action of the diode ring that is already explained in detail above, differential currents, which are produced from the charge and discharge currents for the reference condenser 4 and the measuring condenser 5, are transported via the first connection 12 of the diode ring and the third connection 14 of the diode ring in the average time. If the reference condenser 4 and the measuring condenser 5 have the same capacitances, the differential currents are produced and come to zero, while at different capacitances of the reference condenser 4 and the measuring condenser 5, differential currents result that—in the average time—flow into or out of the first connection 12 of the diode ring, and thus, correspondingly, flow out of or into the third connection 14 of the diode ring. In the analysis unit in FIG. 1, which is known from the prior art, the two differential currents are converted first into voltages, and the two voltages are processed into a differential voltage and compared to a threshold voltage specified in the analysis unit 7. Depending on the ratio of differential voltage to threshold voltage, it can thus be found whether the measuring condenser 5 in a ratio to the reference condenser 4 has reached a specific capacitance or not. The capacitance of the measuring condenser 5 in this case usually is varied by an object approaching the active electrode of the measuring condenser 5 or by a change in the material of the surrounding area of the active electrode of the measuring condenser 5 by means of a medium that is to be detected (fill-level measurement).

Figure 2:
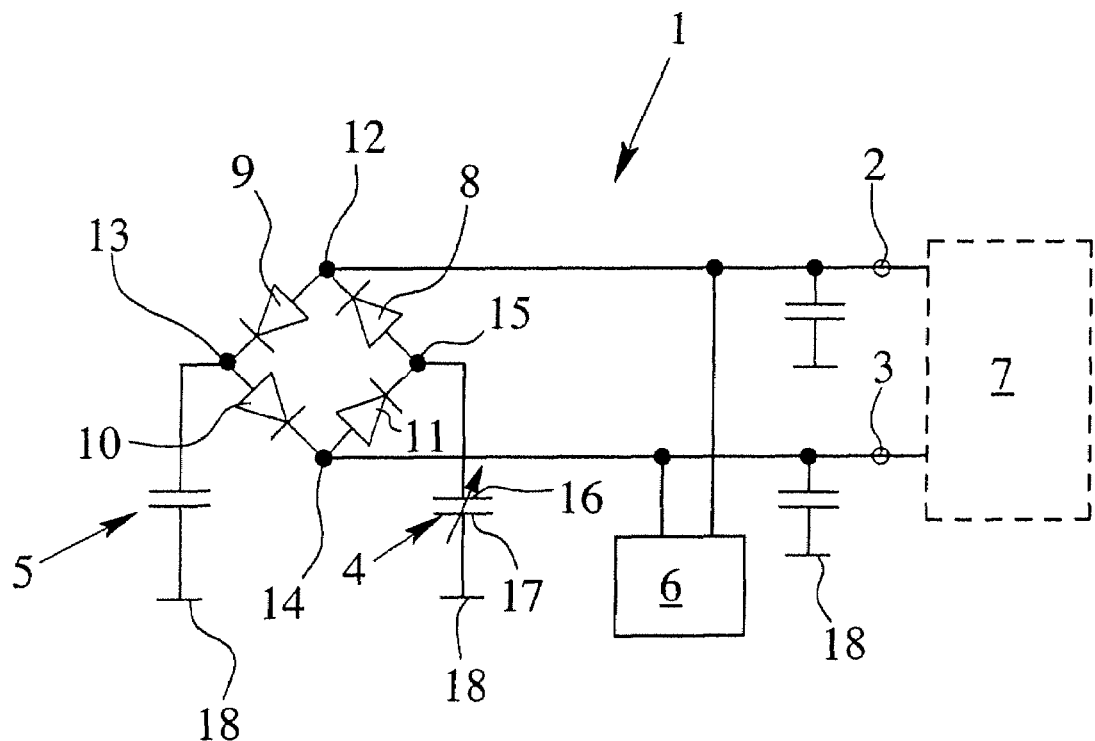
FIG. 2 shows a first embodiment of a capacitive sensor according to the invention with a tunable reference condenser.

The embodiment of a capacitive sensor 1 that is shown in FIG. 2 is distinguished in that the reference condenser 4 can be tuned, and its capacitance thus can be adjusted. As a result, since the reference condenser 4 can be tuned, the zero point adjustment that is known from the prior art—presetting of a threshold value—had been moved from the analysis unit 7 into the actual sensor area. Apart from the fact that the analysis unit 7 is now configured significantly more simply in terms of circuit engineering and is, therefore, also to be manufactured significantly more advantageously, the embodiment according to FIG. 2 also has considerable advantages with respect to the dependency of the measuring result on the stability and quality of the alternating signal, which is fed from the alternating signal source 6 into the diode ring. The advantage is substantiated in that the reference condenser 4 or the capacitance of the reference condenser 4 in the desired state of influence of the measuring condenser 5 is tuned to the capacitance of the measuring condenser 5. As a result, in the state of influence of the measuring condenser 5 that is to be detected in the average time, the differential currents, which flow into or out of the first connection 12 and the third connection 14 of the diode ring, come to zero, specifically, independently of one another, and this occurs regardless of whether the alternating signal produced from the electrical alternating signal source 6 is variable in frequency and in amplitude.

In the known embodiment according to FIG. 1, the level of the currents resulting in the average time, which flow into or out of the first connection 12 of the diode ring or the third connection 14 of the diode ring, depends on the frequency and the amplitude of the alternating signal from the electrical alternating signal source 6, such that in the state of influence, the difference of the two resulting currents is also dependent on whether the frequency and the amplitude of the alternating signal are constant, i.e., are kept stable.

Figure 3:
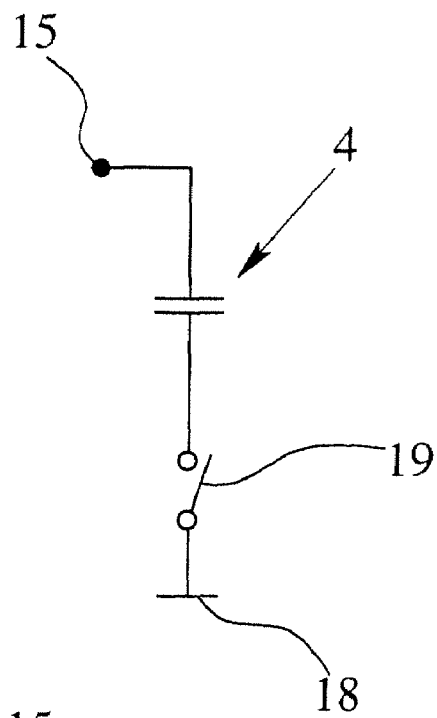
FIG. 3 shows a preferred embodiment of the tunable reference condenser of the capacitive sensor according to FIG. 2, FIGS. 4a & 4b show additional embodiments of tunable reference condensers for capacitive sensors according to the invention.

In the embodiment according to FIG. 3, the tunability of the reference condenser 4 is achieved in that the reference condenser 4 can be switched—at least partially—via a switch 19. In the embodiment that is shown, in this case, the second electrode 17 of the reference condenser 4 is connected to the reference potential 18 or separated from the reference potential 18 by the switch 19. As a result, it is ensured that the reference condenser 4 can be charged only at the times in which the switch 19 has produced a connection with the reference potential 18. If the switch 19 is to be closed only temporarily at the times at which the reference condenser 4 could theoretically be charged or discharged based on the voltage that is present at the fourth connecting point 15, the reference condenser 4 will also be only partially charged, so that such a reference condenser 4 is simulated, which has a smaller capacitance than the actual nominal capacitance of the reference condenser 4. With the switch indicated in FIG. 3, capacitances of the reference condenser 4, which lie between the zero capacitance and the nominal capacitance of the reference condenser 4, can thus be set.

Figure 4A:
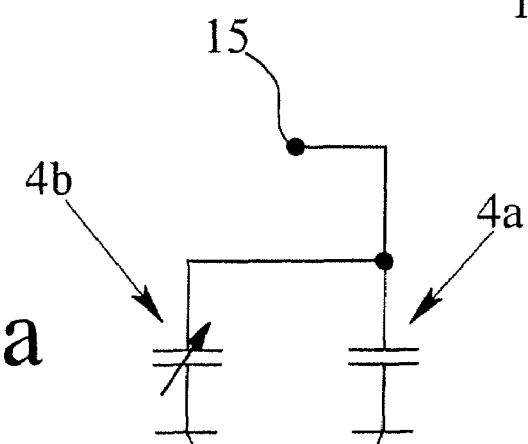
Figure 4B:
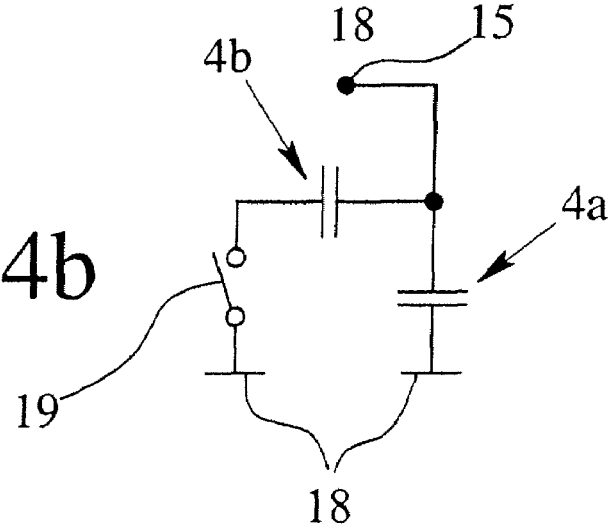

In FIGS. 4a & 4b, in each case, another embodiment of a tunable reference condenser 4 is shown. FIG. 4a shows that the reference condenser 4 is formed of a first, non-tunable reference condenser 4a and a second, tunable reference condenser 4b, whereby the first, non-tunable reference condenser 4a and the second, tunable reference condenser 4b are switched in parallel. The capacitance of this arrangement can accordingly be set between the nominal capacitance of the first, non-tunable reference condenser 4a and the sum of the nominal capacitances of the first, non-tunable reference condenser 4a and the second, tunable reference condenser 4b. FIG. 4b shows the production of the tunable reference condenser 4b via a switch 19, which is arranged between the second, tunable reference condenser 4b and the reference potential 18.

Figure 5:
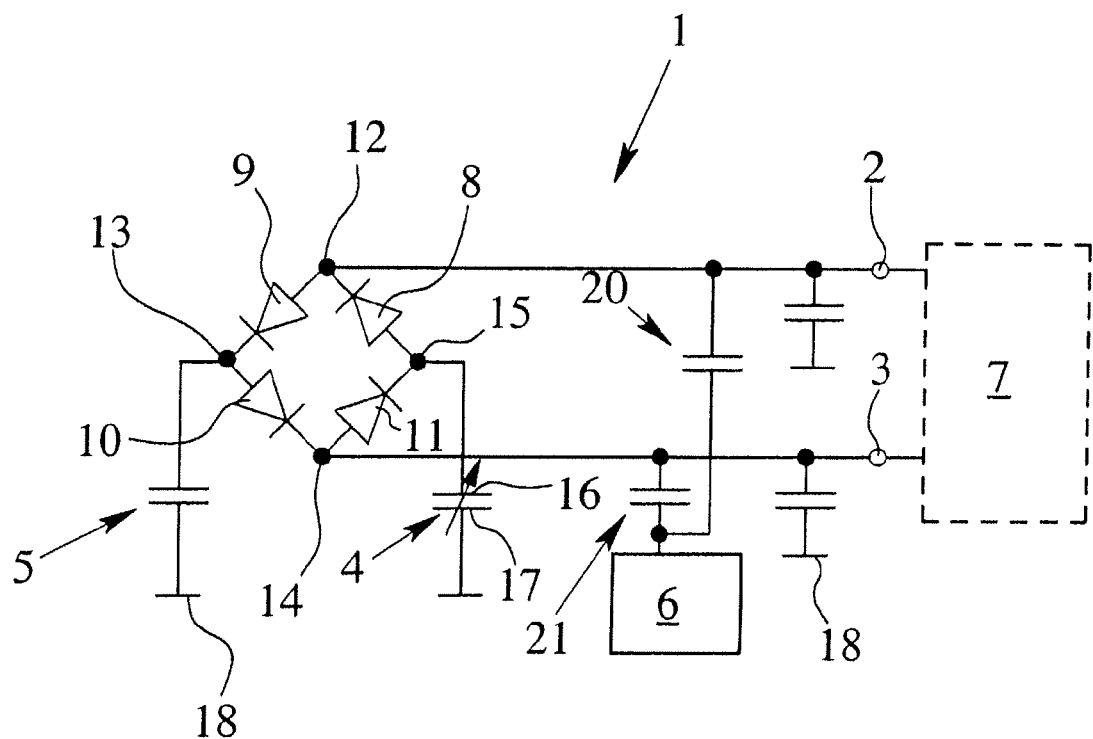
FIG. 5 shows a second embodiment of a capacitive sensor according to the invention.

FIG. 5 shows an embodiment that implements the second independent teaching of the invention, whereby the second teaching of the invention can be combined easily with the previously explained first teaching of the invention.

The capacitive sensor 1 shown in FIG. 5, in turn, has a first connection 2 and a second connection 3, a reference condenser 4 and a measuring condenser 5, an alternating signal source 6, an analysis unit 7 as well as a diode ring with a first diode 8, a second diode 9, a third diode 10 and a fourth diode 11. The above-mentioned components of the capacitive sensor 1 are connected to one another in FIG. 5 in the same way as has already been described based on FIG. 1.

Within the scope of the invention, it has been found that the capacitive sensor according to FIG. 1, known from the prior art, with a working frequency in the range of about 2 MHz is virtually unsuitable to produce a reliable fill-level measurement. This relates to the fact that, at such frequencies, it is often not possible to distinguish, by means of instruments, whether the capacitive sensor 1 is surrounded by a large volume of the medium to be detected or whether the sensor 1 is affected only by a small amount of adhesion that has been left at the sensor 1, after the fill level has dropped below the position of the capacitive sensor 1. As has been found according to the invention, the two above-described situations are distinguishable when the operation is performed with significantly higher frequencies of the alternating signal.

The coupling of very high-frequency electrical alternating signals cannot be reliably assimilated with the method of inductive coupling known from the prior art or is associated with many drawbacks, which are linked, in particular, to the frequency dependency of permeability of materials, and thus, the undesired frequency dependency of inductivities. Therefore, according to the invention, it is provided to connect the alternating signal source 6 via a first coupling condenser 20 to the first connection 12 of the diode ring and to connect the alternating signal source 6 via a second coupling condenser 21 to the third connection 14 of the diode ring.

Figure 6:
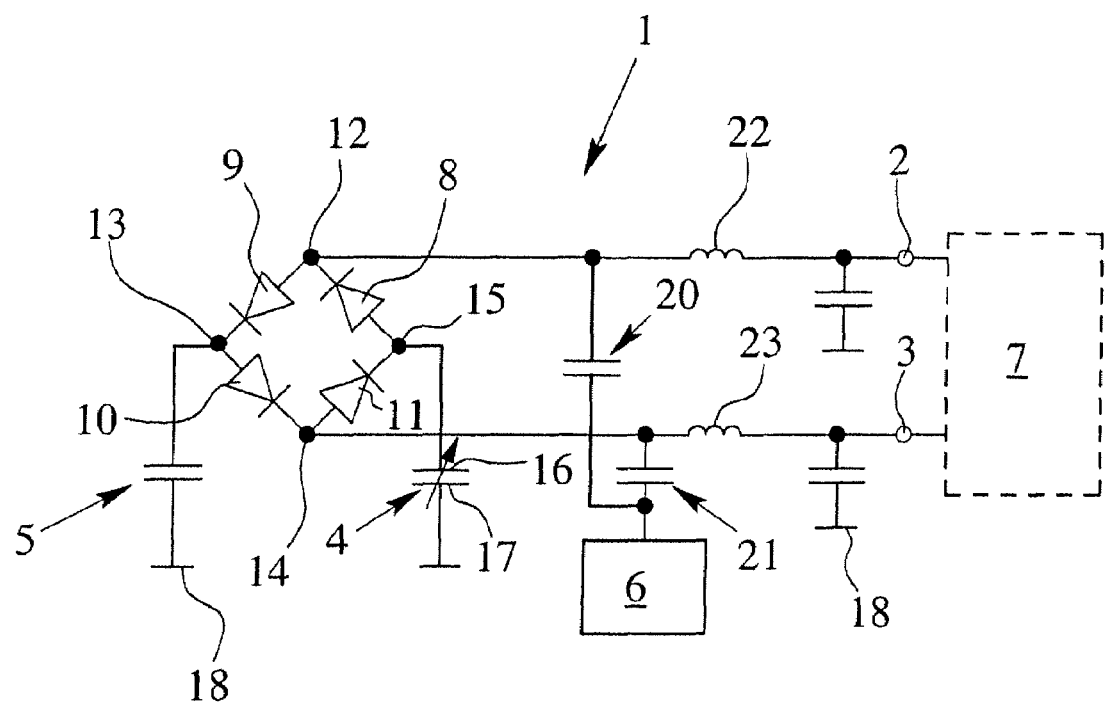
FIG. 6 shows a third embodiment of a capacitive sensor according to the invention.

In the embodiment according to FIG. 6, the first connection 12 of the diode ring is connected via a first coil 22 to the first connection 2 of the capacitive sensor 1, and the third connection 14 of the diode ring is connected via a second coil 23 to the second connection 3 of the capacitive sensor 1. In contrast to the coils in the capacitive sensors 1 that are known from the prior art, the coils 22, 23 are not used in the inductive coupling of an alternating signal from the alternating signal source 6, but rather they are used in the decoupling of the analysis unit 7; they thus act as choke coils.

In the embodiments according to FIGS. 5 and 6, the alternating signal source 6 is configured such that the frequency of the alternating signals—in a desired range—can be preset. In the embodiments shown, the alternating signal source 6 is embodied as a voltage-controlled oscillator. By the variability of the frequency of the alternating signals, the capacitive sensor 1 that is shown can easily be matched to the physical properties of various media, which is advantageous in particular for the purpose of the fill-level measurement and in connection with the above-described problems with residual adhesions left on the sensor 1.

In the embodiments shown in FIGS. 5 and 6, the alternating signal source 6 is set in such a way that it produces alternating signals at a frequency of 434 MHz. In this case, this is a frequency within a released ISM Band (Industrial, Scientific and Medical Band). In addition to the advantage that frequencies within such an ISM band must be used license-free, there is another advantage of the selected frequency in that the frequency is so high that the above-described "residual adhesion problem" no longer occurs in most media that are to be detected by means of instruments.

Figure 7:
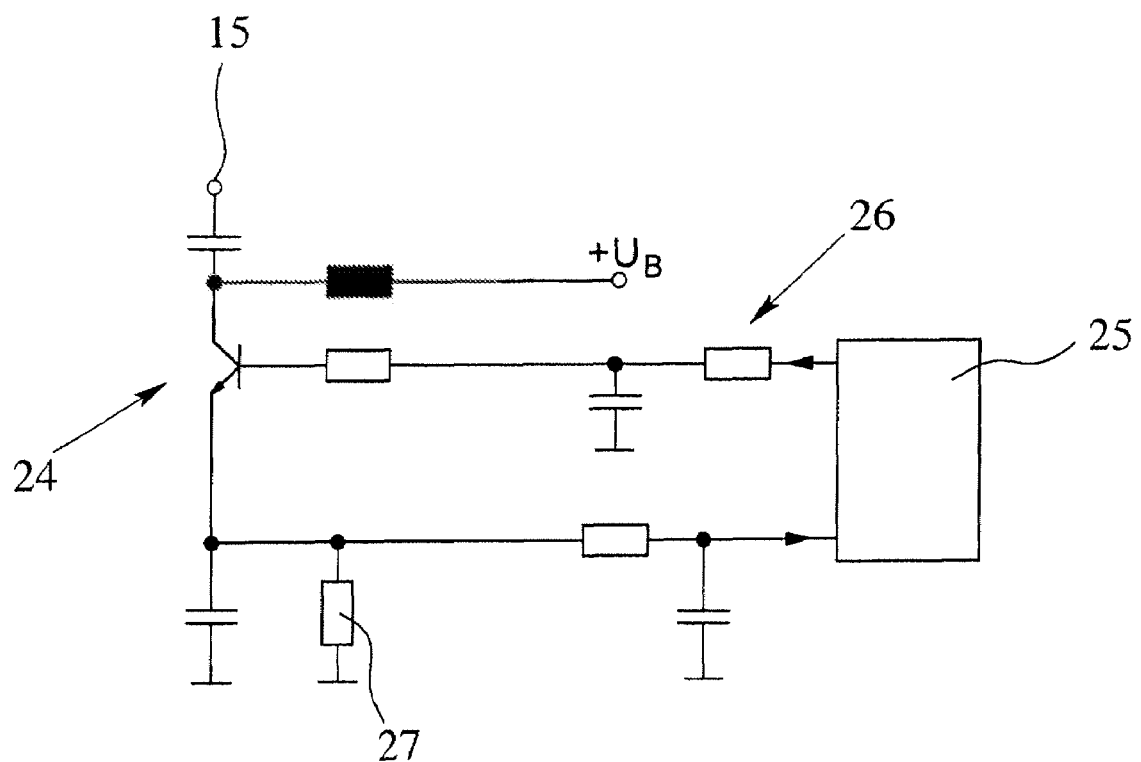
FIG. 7 shows the production of the reference impedance with a transistor as a semiconductor component.
Figure 8:
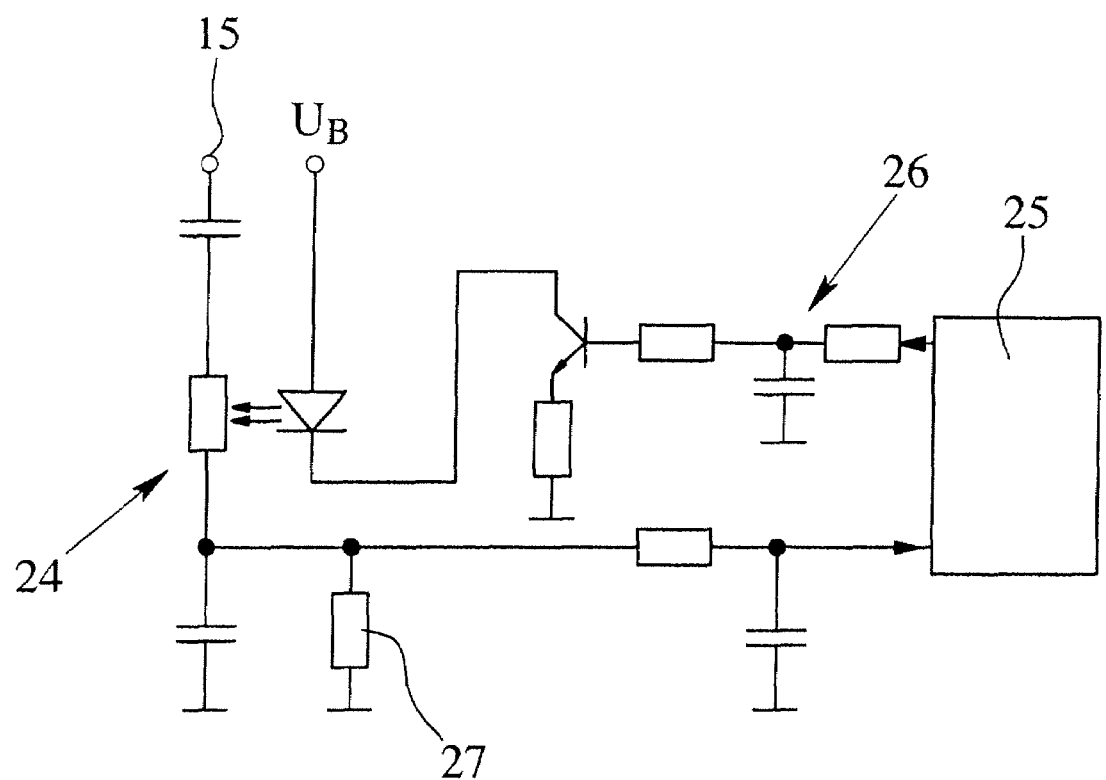
FIG. 8 shows the production of the reference impedance with a photodiode or an optical coupler as a semiconductor component.
Figure 9:
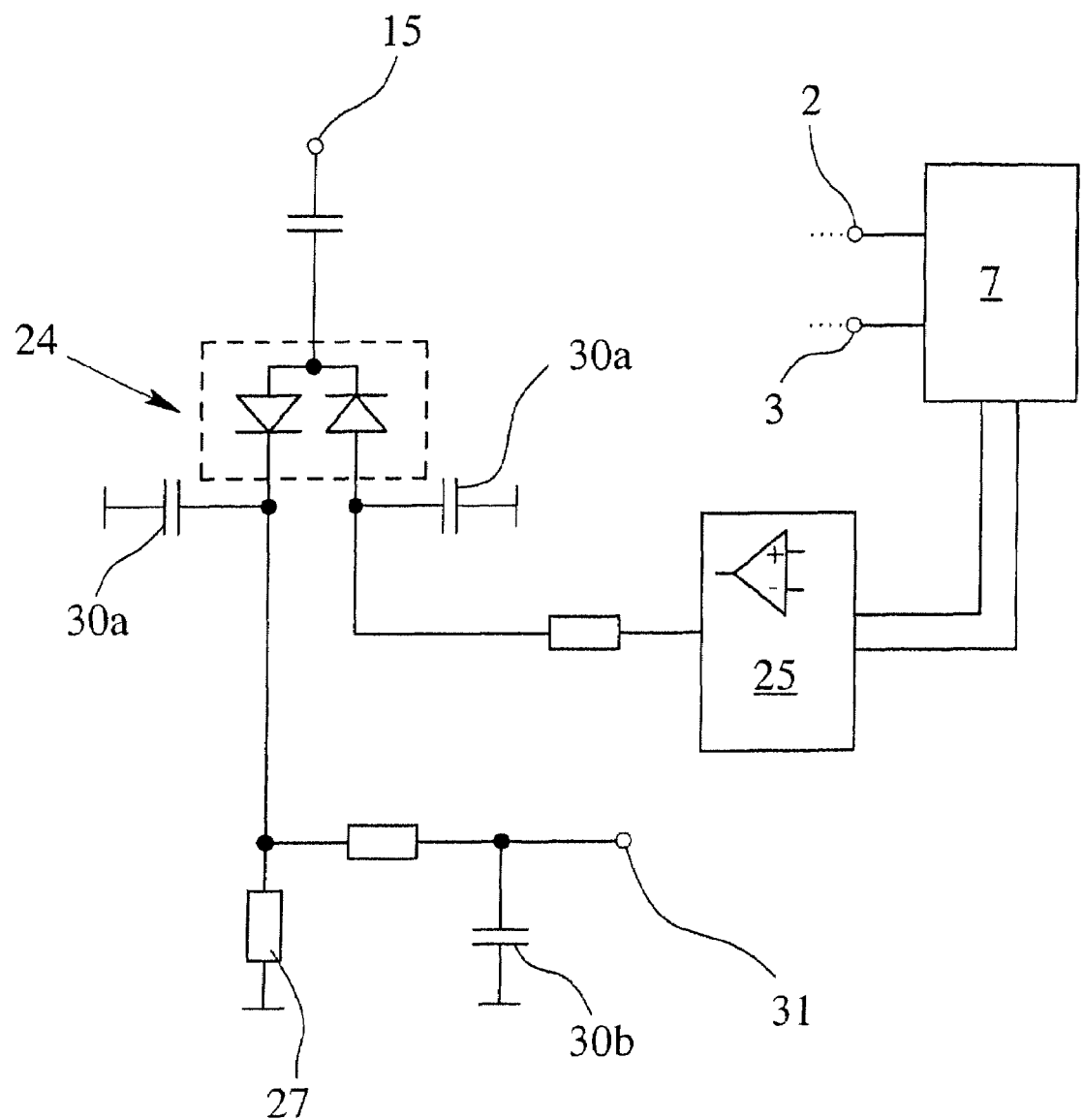
FIG. 9 shows the production of the reference impedance with a double diode as a semiconductor component.

In FIGS. 7, 8 and 9, three embodiments are shown in which the reference impedance is produced via a switch, in each case, that contains a semiconductor component 24. For reasons of clarity, the residual circuit is not shown, but in each case is embodied as shown in, e.g., FIG. 2.

In the embodiments according to FIGS. 7 and 8, the semiconductor component 24 is triggered by a pulse-width-modulated signal that is produced by a control device 25, whereby the pulse-width-modulated signal is filtered by a low pass 26 before it reaches the semiconductor component 24 directly or indirectly. The low pass 26 has the effect of smoothing the pulse-width-modulated signal, whereby present at the output of the low pass 26—assuming a pulse-width-modulated signal with an invariant pulse duty factor—an essentially constant signal exists to trigger the semiconductor component 24, whose level depends only on the pulse duty factor of the pulse-width-modulated signal.

In FIG. 7, the semiconductor component 24 is a bipolar npn transistor, and in FIG. 8, the semiconductor component 24 is a photoconductive cell or, if the LED that is shown and the photoconductive cell are present in the subassembly, an optical coupler. In both cases, the control electrodes of the semiconductor component 24 are triggered via the pulse-width-modulated signal of the control device 25, indirectly via the low pass 26.

In the embodiments according to FIGS. 7 & 8, in each case, the semiconductor component 24 is connected via a coil to the operating voltage $U_b$ so that, as a whole, the working point, and thus, the impedance of the semiconductor component 24 can be set in the current path between the fourth connection 15 of the diode ring and the ground. The coil blocks high-frequency signals, originating from the fourth connection 15 of the diode ring, in the direction toward the supply voltage $U_B$ so that the charge and discharge currents flow through the semiconductor component 24.

In the embodiments according to FIGS. 7 and 8, the control device 25 detects the current that flows through the semiconductor component 24 and determines the impedance of the semiconductor component 24 from the detected current. As a result, it is possible for the control device 25 to adjust the impedance of the semiconductor component 24 to a specified impedance value by suitable actuation of the semiconductor component 24. The detection of the current that flows through the semiconductor component 24 is carried out by the current sensing resistor 27, at which a corresponding voltage drops. The voltage signal is filtered through another low pass in the embodiments shown, before it is detected by the control device 25. A control circuit is thus produced by the recycling of the voltage dropping via the current sensing resistor 27.

In the embodiments shown in FIGS. 7 to 9, the control device 25 adjusts—or the analysis unit 7 and the control device 25 determine—the value of the reference impedance—essentially produced by the semiconductor component 24—by the value of the reference impedance being readjusted to the value of the impedance of the measuring condenser. In the embodiments shown, this is converted by the charge and discharge currents of the reference impedance being adjusted so that they correspond to the charge and discharge currents of the measuring condenser 5, so that the current supply network is compensated for in the form of four diodes 8, 9, 10, 11 that are connected one behind the other in series and in the same direction.

To detect the charge and discharge currents or to detect the associated voltages at the first connection 2 and at the second connection 3 of the capacitive sensor, the control device 25 is connected to the analysis unit 7, which is not expressly shown in FIGS. 7 and 8 but can be detected in FIG. 9. In the embodiment according to FIG. 9, a double diode is used as a semiconductor component 24. The control device 25 obtains from the analysis unit 7 the detected voltages, which also are right next to the first connection 2 and the second connection 3 of the capacitive sensor. The control device 25 essentially is formed of a differential amplifier, whose output signal—and thus, the current through the double diode—is changed until the initial differential voltage is at zero, which has the same meaning here as the same charge and discharge currents of the measuring capacitance 5 and the reference impedance, from which the value of the impedance of the measuring capacitance 5 can easily be derived.

The two diodes of the double diode in FIG. 9 are parallel in terms of alternating current via the two condensers 30a, which have a capacitance of 100 pF here, and are grounded. For low-frequency signals, the two diodes are connected in series, whereby the—low-frequency—current that flows via the two diodes of the semiconductor component 24 flows out over the current sensing resistor 27 from the ground, and the voltage that drops at the current sensing resistor can be tapped off at connection 31; the condenser 30b smoothes the signal characterizing the current flow through the double diode and thus the working point of the double diode. The signal that is present at the connection 31 can be further used by the analysis unit or the control device 25, which is not shown in detail.

The fact that the analysis unit 7 and the control device 25 are shown separately as a whole is used here only for the purpose of clarity. Actually, the analysis unit 7 and the control device 25 can be produced in a circuit engineering unit, such as, e.g., a microcontroller, which has the result that the analysis unit 7 and the control device 25 are automatically "connected to one another."

Figure 10:
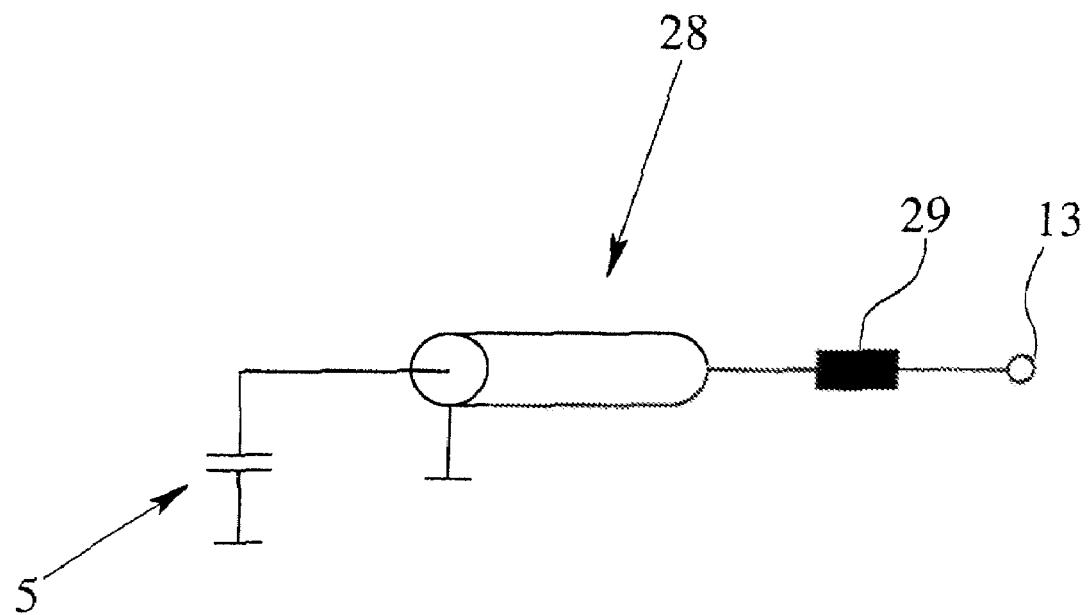
FIG. 10 shows an embodiment for the configuration of the measuring condenser with an electrical line to a resonator.

In FIG. 10, another embodiment of a capacitive sensor, in which, namely, the measuring condenser 5 is connected to the current supply network—indicated here only via the second connection 13 of the diode ring—via an electrical line 28, specifically so that the electrical line 28 and the measuring condenser 5 form a resonator, which electrically oscillates with suitable excitation, is shown in parts. In the embodiment shown, the electrical line 28 is a coaxial line, whereby the thus produced resonator is a $\lambda/4$ resonator, also known as a $\lambda/4$ line. Thus, in a simple way, resonance frequencies up to the gigahertz range can be achieved.

Since the resonance frequency of the resonator depends on, i.a., the length of the electrical line 28, i.e., the length of the coaxial line, design considerations limit the dimensions of the coaxial line, however, and the resonance frequency of the resonator is matched to the electrical path. In FIG. 10, a coil 29 is provided in the electrical line 28, whereby the resonance frequency of the resonator is reduced by the inductivity of the coil 29. In the embodiment depicted in FIG. 10, the resonance frequency of the resonator is about 150 megahertz, a frequency in which, with a medium, only slight adhesions on the sensor can be easily distinguished from large-volume surrounding areas of the sensor.

In the embodiments of a capacitive sensor at least partially shown in FIGS. 7 and 8, the analysis unit 7 and the control device 25 are configured such that the impedance of the measuring condenser can be determined by measuring the resonance frequency of the resonator and the current that flows in the case of resonance; to do this, the excitation frequency of the electrical alternating signal source 6 always passes through a relevant frequency range ("frequency wobbling").

Figure 11:
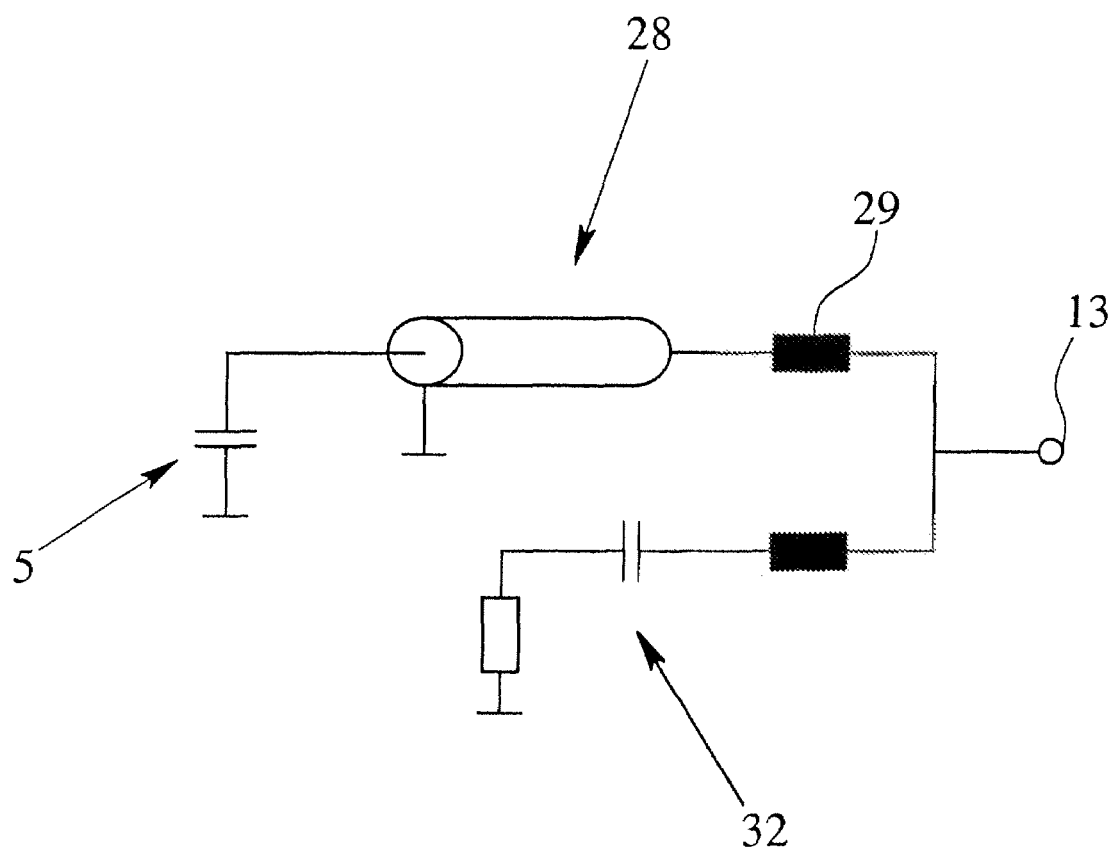
FIG. 11 shows an embodiment with a resonator according to FIG. 10 with an additional reference resonator.

In FIG. 11, in turn, only a portion of an embodiment of a capacitive sensor is shown, which is built up in the embodiment according to FIG. 10. Here, a reference resonator 32 is switched in parallel to the resonator, whereby the reference resonator 32 essentially cannot be influenced electrically from the outside, in particular, not by the medium that influences the resonator or by the measuring capacitance 5 of the resonator. In addition, it is provided that the resonance frequency of the reference resonator 32 deviates from the resonance frequency of the resonator. This detuning of the two resonators is intended to be able to distinguish the resonators from one another, in particular, based on their contributions to a common frequency response.

The resonance frequency of the reference resonator 32 is preferably selected so that it lies outside the range of the resonance frequencies of the resonator that can be covered by different states of influence of the measuring capacitance 5. As a result, the resonance frequency of the resonator is reliably prevented from being mistaken for the resonance frequency of the reference resonator 32. If the reference resonator 32 preferably has essentially the same components as the resonator, in particular an essentially identical electrical line, then the reference resonator 32 represents, as it were, a parallel model of the resonator, in which changes can be observed that cannot have been caused by an external influence of the capacitive sensor.

As a whole, a capacitive sensor is equipped with a resonator and a reference resonator 32 instead of only one measuring capacitance so that the alternating signal source 6 and/or the analysis unit 7 and/or the control device 25 is/are configured such that the resonator and the reference resonator 32 can be excited in a suitable frequency range ("wobbling"), the amplitude response of the differential current and/or the differential voltage of the charge and discharge currents can be detected, the resonance frequency of the reference resonator 32 can be determined, and the value of the resonance frequency of the reference resonator 32 that is detected can be compared to a specified value of the resonance frequency of the reference resonator 32, and a deviation of both values indicates the existing property drift of the reference resonator 32 and the resonator. Property drift is defined as, for example, the change in component properties that occurs under the influence of temperature—temperature drift—however, for example, aging-induced changes of the previously depicted sensors can be detected. The knowledge on the property drift of the reference resonator 32 can be transferred to the resonators that can be influenced externally, so that property drifts can be taken into consideration in the analysis of collected measuring data and can be used for, e.g., temperature compensation.

What is claimed is:

1. Capacitive sensor, comprising:
    at least one reference impedance,
    at least one measuring condenser,
    at least one electrical alternating signal source,
    a current supply network, and
    an analysis unit,
    wherein the reference impedance and the measuring condenser are connected via the current supply network with the at least one electrical alternating signal source and the analysis unit in such a way that the charge and discharge currents of the reference impedance and the measuring condenser are able to be at least partially analyzed the analysis unit, and
    wherein the reference impedance is a tunable reference impedance,
    wherein a first connection and a second connection with the analysis unit are provided, wherein a diode ring is provided that is formed of at least first, second, third and fourth diodes that are connected one behind the other in series and in the same direction, wherein the diode ring has a first connection between the first diode and the second diode, a second connection between the second diode and the third diode, a third connection between the third diode and the fourth diode, and a fourth connection between the fourth diode and the first diode, wherein a first electrode of the at least one reference impedance is connected to the fourth connection of the diode ring, a second electrode of the at least one reference impedance is connected to a reference potential, wherein a first electrode of the at least one measuring condenser is connected to the second connection of the diode ring, wherein the first connection with the analysis unit is connected to the first connection of the diode ring, and the second connection with the analysis unit is connected to the third connection of the diode ring, and wherein an electrical alternating signal from the at least one electrical alternating signal source is fed to the first connection of the diode ring and the third connection of the diode ring,
    wherein a switch is provided for switching the reference impedance, at least one of the connection of the second electrode of the reference impedance with the reference potential and the connection of the first electrode of the reference impedance with the first connection of the diode ring.

2. Capacitive sensor according to claim 1, wherein the switch is actuatable by a pulse-width-modulated signal, and the pulse-width-modulated signal has a frequency below a frequency of the alternating signals from the alternating signal source.

3. Capacitive sensor, comprising:
    an analysis unit,
    at least a first connection and a second connection with the analysis unit,
    at least one reference impedance,
    a measuring condenser,
    at least one electrical alternating signal source,
    a diode ring that consists of at least first, second, third and fourth diodes that are connected one behind the other in series and in the same direction,
    wherein the diode ring has a first connection between the first diode and the second diode, a second connection between the second diode and the third diode, a third connection between the third diode and the fourth diode, and a fourth connection between the fourth diode and the first diode,
    wherein a first electrode of the reference impedance is connected to the fourth connection of the diode ring, a second electrode of the reference impedance is connected to a reference potential, and a first electrode of the measuring condenser is connected to the second connection of the diode ring, the first connection with the analysis unit is connected to the first connection of the diode ring, and the second connection with the analysis unit is connected to the third connection of the diode ring,
    wherein an electrical alternating signal from the electrical alternating signal source is fed to the first connection of the diode ring and the third connection of the diode ring,
    wherein the alternating signal source is connected via a first coupling condenser to the first connection of the diode ring and via a second coupling condenser to the third connection of the diode ring, and
    wherein the first connection of the diode ring is connected via a first coil to the first connection with the analysis unit, and the third connection of the diode ring is connected via a second coil to the second connection with the analysis unit.

4. Capacitive sensor according to claim 3, wherein alternating signals from the alternating signal source have a frequency that is preset in a desired range and wherein the alternating signal source comprises a controlled oscillator.

5. Capacitive sensor according to claim 3, wherein the alternating signal source produces alternating signals at a frequency of more than 10 MHz.

6. Capacitive sensor according to claim 3, wherein the alternating signal source produces alternating signals at a frequency of more than 100 MHz.

7. Capacitive sensor, comprising:
    an analysis unit,
    at least a first connection and a second connection with the analysis unit,
    at least one reference impedance,
    a measuring condenser, at least one electrical alternating signal source,
a diode ring that consists of at least first, second, third and fourth diodes that are connected one behind the other in series and in the same direction,
wherein the diode ring has a first connection between the first diode and the second diode, a second connection between the second diode and the third diode, a third connection between the third diode and the fourth diode, and a fourth connection between the fourth diode and the first diode,
wherein a first electrode of the reference impedance is connected to the fourth connection of the diode ring, a second electrode of the reference impedance is connected to a reference potential, and a first electrode of the measuring condenser is connected to the second connection of the diode ring, the first connection with the analysis unit is connected to the first connection of the diode ring, and the second connection with the analysis unit is connected to the third connection of the diode ring,
wherein an electrical alternating signal from the electrical alternating signal source is fed to the first connection of the diode ring and the third connection of the diode ring,
wherein the alternating signal source is connected via a first coupling condenser to the first connection of the diode ring and via a second coupling condenser to the third connection of the diode ring, and
wherein the reference impedance comprises one of a first, non-tunable reference condenser and a first, non-tunable reference resistor and one of a second, tunable reference condenser and a second, tunable reference resistor, and wherein said one of the first, non-tunable reference condenser and first, non-tunable reference resistor, and said one of the second, tunable reference condenser and the second, reference resistor are switchable in parallel.

8. Capacitive sensor according to claim 7, wherein the reference impedance is produced by at least one semiconductor component, wherein a control device is provided which produces a pulse-width-modulated signal, wherein the semiconductor component is triggerable by the pulse-width-modulated signal from the control device, and wherein a low pass filter is provided with which the pulse-width-modulated signal is filtered.

9. Capacitive sensor according to claim 8, wherein the at least one semiconductor component comprises one of a bipolar transistor in an emitter follower circuit a junction field effect transistor (JFET), a photoconductive cell, an optical coupler and a double diode, and wherein a control electrode of the semiconductor component is triggered by the pulse-width-modulated signal.

10. Capacitive sensor according to claim 8, wherein the control device is adapted to detect current that flows through the semiconductor component, determines the impedance of the semiconductor component from the detected current, and adjusts the impedance of the semiconductor component by triggering of the semiconductor component at a specified impedance value.

11. Capacitive sensor according to claim 8, wherein the control device tunes the reference impedance, such that the value of the reference impedance follows the value of the impedance of the measuring condenser by charge and discharge currents of the reference impedance and the measuring condenser being adjusted to essentially the same value.

12. Capacitive sensor, comprising:
at least one reference impedance,
at least one measuring condenser,
at least one electrical alternating signal source,
a current supply network, and
an analysis unit,
wherein the reference impedance and the measuring condenser are connected via the current supply network with the at least one electrical alternating signal source and the analysis unit in such a way that the charge and discharge currents of the reference impedance and the measuring condenser are able to be at least partially analyzed the analysis unit, and
wherein the reference impedance is a tunable reference impedance,
wherein the measuring condenser is connected via an electrical line to the current supply network so that the electrical line and the measuring condenser form a resonator, and
wherein a coil is provided for influencing the resonance frequency of the resonator, and wherein the resonance frequency of the resonator is reduced by the inductivity of the coil.

13. Capacitive sensor, comprising:
at least one reference impedance,
at least one measuring condenser,
at least one electrical alternating signal source,
a current supply network, and
an analysis unit,
wherein the reference impedance and the measuring condenser are connected via the current supply network with the at least one electrical alternating signal source and the analysis unit in such a way that the charge and discharge currents of the reference impedance and the measuring condenser are able to be at least partially analyzed the analysis unit, and
wherein the reference impedance is a tunable reference impedance,
wherein the measuring condenser is connected via an electrical line to the current supply network so that the electrical line and the measuring condenser form a resonator, and
wherein at least one of the alternating signal source, the analysis unit and a control device is configured such that the impedance of the measuring condenser is analyzable by measuring the resonance frequency of the resonator and a current that flows in the case of resonance.

14. Capacitive sensor, comprising:
at least one reference impedance,
at least one measuring condenser,
at least one electrical alternating signal source,
a current supply network, and
an analysis unit,
wherein the reference impedance and the measuring condenser are connected via the current supply network with the at least one electrical alternating signal source and the analysis unit in such a way that the charge and discharge currents of the reference impedance and the measuring condenser are able to be at least partially analyzed the analysis unit, and
wherein the reference impedance is a tunable reference impedance,
wherein the measuring condenser is connected via an electrical line to the current supply network so that the electrical line and the measuring condenser form a resonator, and
wherein at least one of the alternating signal source, the analysis unit and the control device is configured such that the resonance frequency of the resonator is determinable, and wherein the measured resonance frequency of the resonator is compared to the resonance frequency of the resonator in an uninfluenced state of the sensor, whereby a difference of the resonance frequencies of the resonator are analyzable.

15. Capacitive sensor, comprising:
at least one reference impedance,
at least one measuring condenser,
at least one electrical alternating signal source,
a current supply network, and
an analysis unit,
wherein the reference impedance and the measuring condenser are connected via the current supply network with the at least one electrical alternating signal source and the analysis unit in such a way that the charge and discharge currents of the reference impedance and the measuring condenser are able to be at least partially analyzed by the analysis unit, and
wherein the reference impedance is a tunable reference impedance, and
wherein the reference impedance is produced by at least one semiconductor component, wherein a control device is provided which produces a pulse-width-modulated signal, wherein the semiconductor component is triggerable by the pulse-width-modulated signal from the control device, wherein a low pass filter is provided with which the pulse-width-modulated signal is filtered, wherein at least one of the analysis unit and the control device is configured such that the impedance of the measuring condenser is analyzable by the resonator being actuated at a selected fixed frequency, and wherein a current that is detected in the influenced state of the measuring condenser is compared to the current that is detected in the uninfluenced state of the measuring condenser.

16. Capacitive sensor, comprising:
at least one reference impedance,
at least one measuring condenser,
at least one electrical alternating signal source,
a current supply network, and
an analysis unit,
wherein the reference impedance and the measuring condenser are connected via the current supply network with the at least one electrical alternating signal source and the analysis unit in such a way that the charge and discharge currents of the reference impedance and the measuring condenser are able to be at least partially analyzed the analysis unit, and
wherein the reference impedance is a tunable reference impedance,
wherein the measuring condenser is connected via an electrical line to the current supply network so that the electrical line and the measuring condenser form a resonator, and
wherein a reference resonator is switched in parallel to the resonator formed by that the electrical line and the measuring condenser, wherein the reference resonator is essentially externally electrically uninfluenceable, wherein a resonance frequency of the reference resonator deviates from a resonance frequency of the resonator formed by that the electrical line and the measuring condenser.

17. Capacitive sensor according to claim 16, further comprising a control device; wherein at least one of the alternating signal source, the analysis unit and the control device is configured such that the resonator formed by that the electrical line and the measuring condenser and the reference resonator are excitable in a frequency range, wherein an amplitude response of at least one of a differential current and a differential voltage of charge and discharge currents are detectable, wherein a resonance frequency of the reference resonator is determinable, wherein a value of the detected resonance frequency of the reference resonator is compared to a preset value of the resonance frequency of the reference resonator, and wherein a deviation of said values indicates an existing property drift of the reference resonator and the resonator.

* * * * *